United States Patent [19]

Miyauchi et al.

[11] Patent Number: 4,875,087
[45] Date of Patent: Oct. 17, 1989

[54] INTEGRATED CIRCUIT DEVICE HAVING STRIP LINE STRUCTURE THEREIN

[75] Inventors: Akira Miyauchi, Kawasaki; Hiroshi Nishimoto, Tokyo; Tadashi Okiyama; Hiroo Kitasagami, both of Kawasaki; Masahiro Sugimoto; Haruo Tamada, both of Yokohama; Shinji Emori, Urawa, all of Japan

[73] Assignee: Fujitsu Limited, Kawasaki, Japan

[21] Appl. No.: 222,303

[22] Filed: Jul. 22, 1988

Related U.S. Application Data

[63] Continuation of Ser. No. 851,205, Apr. 14, 1986.

[30] Foreign Application Priority Data

Apr. 13, 1985 [JP] Japan ............................ 60-077550

[51] Int. Cl.⁴ ....................... H01L 23/12; H01L 23/14
[52] U.S. Cl. .................................... 357/71; 357/74; 357/80
[58] Field of Search ........................... 357/71, 74, 80; 333/247

[56] References Cited

U.S. PATENT DOCUMENTS

| 4,047,132 | 9/1977 | Krajewski | 333/84 |
| 4,259,684 | 3/1981 | Dean et al. | 333/247 |
| 4,276,558 | 6/1981 | Ho et al. | 357/80 |
| 4,498,122 | 2/1985 | Rainal | 174/36 |

FOREIGN PATENT DOCUMENTS

| 0198621 | 10/1986 | European Pat. Off. |
| 2007911 | 5/1979 | United Kingdom |
| 2181300 | 4/1987 | United Kingdom |

OTHER PUBLICATIONS

IEEE Proceedings, vol. 128, part H, No. 1, Feb. 1981, pp. 26–33; Hall et al., "Design of Microstrip Antenna Feeds. Part 2: Design and Performance Limitations of Triplate Corporate Feeds".

Patent Abstracts of Japan, vol. 8, No. 285 (E-287)[1722], Dec. 26, 1984; and JP-A-59 152 649 (Nippon Denki K.K.) Aug. 31, 1984.

European Search Report, The Hague, 05-19-88.

*Primary Examiner*—Rolf Hille
*Assistant Examiner*—S. V. Clark
*Attorney, Agent, or Firm*—Staas & Halsey

[57] ABSTRACT

An integrated circuit device including: at least one semiconductor chip (3) having a plurality of circuit elements; a package (21 to 24) enclosing the semiconductor chip with a hermetic seal; and a strip line unit (15-2, 11-1b, 11-2, 20 and 23:15-1, 11-1, 11-2, 11-3, 12-1 and 20) for connecting the circuit elements in the semiconductor chip to circuit outside of the package. The stripline unit having a microstrip line structure and a triplate strip line structure serial-connected to the microstrip line structure and connecting the outside circuits. The triplate strip line structure has a characteristic impedance equal to that of the microstrip line structure so that the strip line unit satisfies the required impedance matching.

A center of the conductive layer strip line of the triplate strip line structure has a smaller width than that of a microstrip line of the microstrip line structure to have a predetermined impedance so that the triplate strip line structure has a same characteristic impedance as that of the microstrip line structure.

7 Claims, 4 Drawing Sheets

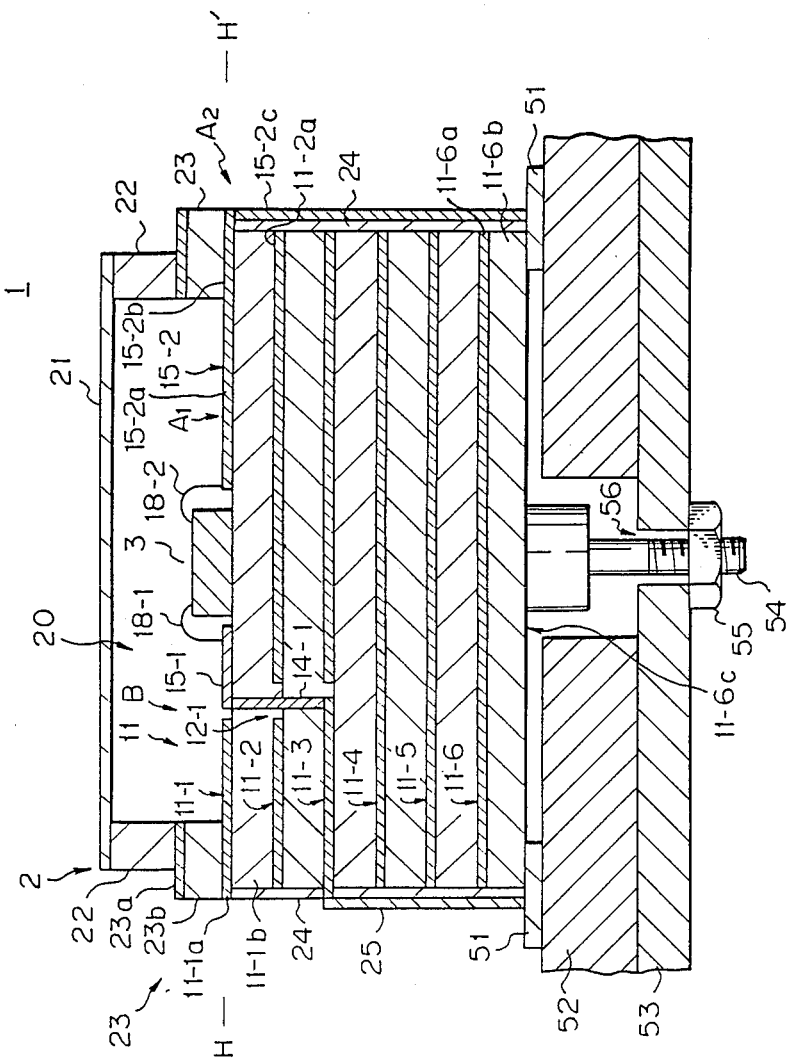

INTEGRATED CIRCUIT DEVICE HAVING STRIP LINE STRUCTURE THEREIN

This is a continuation of co-pending application Ser. No. 851,205 filed on Apr. 14, 1986.

FIELD OF THE INVENTION

The present invention relates to an integrated circuit device. More particularly, it relates to an integrated circuit device suitably applicable to a high speed operation circuit and including a stacked layer unit having a triplate strip line structure therein.

DESCRIPTION OF THE RELATED ART

Semiconductor integrated circuit (IC) chips in which a plurality of circuit elements, such as transistors and resistors, are formed in a semiconductor chip of silicon (Si), gallium-arsenic (GaAs), etc., and which, for example, are operable for high-speed (e.g., one giga bits per second), data processing or optical data processing, are known. Such semiconductor IC chips must be naturally hermetically sealed by a package in the same way as for normal semiconductor IC chips.

In high speed IC devices, connection (lead) wires of resistive material between circuit elements in the device must be regarded as not only resistance components but also as inductance components, due to the application thereto of a high frequency, and wires having a low resistance and low inductance are required for high speed signal transfer lines, On the other hand, wires having a high inductance are required for power supply lines and low speed signal transfer lines, to improve isolation between different power sources and between the circuit elements in the device. In high speed IC devices, since an impedance matching of the connection wires is also required, conventional wire connection technology as used in well known semiconductor IC devices cannot be used. Accordingly, the high speed IC devices are provided with multi-stacked layers, each consisting of an insulation layer and a plurality of conductive layer strips, and connection members embedded in the multi-stacked layers in a direction perpendicular to the planes of the stacked layers. The IC chip in which the circuit elements are formed is mounted on the top of the stacked layers and hermetically sealed by the package. The connection of the circuit elements in the IC device is achieved by the connection members and the conductive layer strips of the multi-stacked layers.

The above impedance matching requirement should be applied to external connection wires connected between the high speed IC device and other high speed IC devices or other high speed operation circuits. Accordingly, triplate strip lines or microstrip lines are used for such external connection wires. However, in the prior art, the triplate strip lines or microstrip lines suffer from the disadvantage of a poor impedance matching capability etc., which will be described later with reference to a specific example. In particular, the above poor impedance matching is not acceptable for high speed IC devices, e.g., approximately more than one giga bits per second.

SUMMARY OF THE INVENTION

An object of the present invention is to provide an integrated circuit device having a good impedance matched strip line structure therein for an external connection wire.

Another object of the present invention is to provide an high speed integrated circuit device having improved high speed signal propagation characteristics.

According to the present invention, there is provided an integrated circuit device including at least one semiconductor chip having a plurality of circuit elements, a package enclosing the semiconductor chip with a hermetic seal, and a strip line unit for connecting the circuit elements in the semiconductor chip to circuits outside of the package, the strip line unit having a microstrip line structure and a triplate strip line structure serially connected to the microstrip line structure and connecting the outside circuits. The triplate strip line structure has a characteristic impedance equal to that of the microstrip line structure, so that the strip line unit has satisfactory impedance matching.

The strip line unit may be formed in a stacked layer unit including at least three stacked layers, each having an insulation layer and at least one conductive layer formed on a surface of the insulation layer, and a cavity defined by the package. A microstrip line of the microstrip line structure is connected in series with a center conductive layer strip of the triplate strip line structure. The center conductive layer strip line has a predetermined impedance so that the triplate strip line structure has the same characteristic impedance as the microstrip line structure.

The microstrip line structure may be formed by a microstrip line having a predetermined thickness and width and facing the cavity, an insulation layer of the stacked layer unit having a predetermined dielectric constant and the microstrip line being mounted thereon in a first plane, and a conductive layer of the stacked layer unit mounted on the insulation layer in a second plane opposite to the plane of the microstrip line.

The triplate strip line structure may be formed by a center conductive layer strip line, directly connected to the microstrip line, and a first insulation layer, the center conductive layer strip line being mounted thereon in a first plane. A second conductive layer is mounted on the first insulation layer in a second plane, and a second insulation layer, having a predetermined dielectric constant and a predetermined length, is formed on the center conductive layer strip line and the first insulation layer, thus forming a part of the package, and a third conductive layer is formed on a third insulation layer.

Preferably, the microstrip line and the center conductive layer strip line have the same thickness, and the center conductive layer strip line has a smaller width than that of the microstrip line along the length of the another insulation layer.

In addition, the triplate strip line structure may be formed by the center conductive layer strip line, a second insulation layer of the stacked layer unit having a predetermined dielectric constant, the conductive layer strip line contacting thereon in a first plane, a second conductive layer formed on the second insulation layer in a second plane, a third insulation layer of the stacked layer unit having a predetermined dielectric constant, the conductive layer strip line mounted thereon at one plane, and a third conductive layer formed of the third insulation layer at another plane. The microstrip line may be formed on a different insulation layer on which the center conductive layer strip line is formed. The microstrip line is connected to the center conductive layer strip line through a conductive member embedded in the second and third insulation layers in a direction perpendicular to a plane of the second and third insulation layers.

The first conductive layer of the microstrip line structure and the second conductive layer of the triplate strip line structure may be unified and positioned on a common level in the stacked layer unit.

Preferably, the microstrip line and the center conductive layer strip line have the same thickness, and the center conductive layer strip line has a smaller width than that of the microstrip line.

The stacked layer unit may be formed as a part of the package. The semiconductor chip is mounted on a top insulation layer of the stacked layer unit. The semiconductor chip and the strip line unit are enclosed by the package and the stacked layer unit with a hermetic seal.

BRIEF DESCRIPTION OF THE DRAWINGS

Other objects and features of the present invention will be described below in detail with reference to the accompanying drawings, in which:

FIG. 1b is a plan view of the IC device taken along the line H—H' in FIG. 1a;

FIG. 2 is a cross-sectional view of an IC device of an embodiment in accordance with the present invention;

FIG. 3b is a cross-sectional view of the IC device taken along the line Y—Y' in FIG. 3a;

DESCRIPTION OF THE PREFERRED EMBODIMENTS

Before describing preferred embodiments of the present invention, an explanation of the prior art will be given.

Figure 1A:
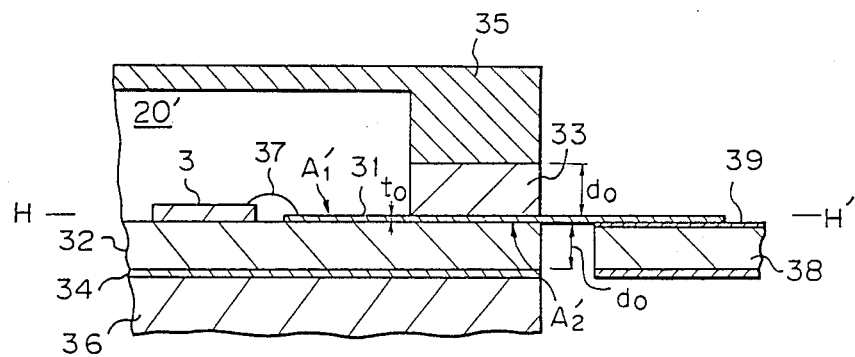
FIG. 1a is a cross-sectional view of a part of an integrated circuit (IC) device of the prior art taken along the line X—X' in FIG. 1b.
Figure 1B:
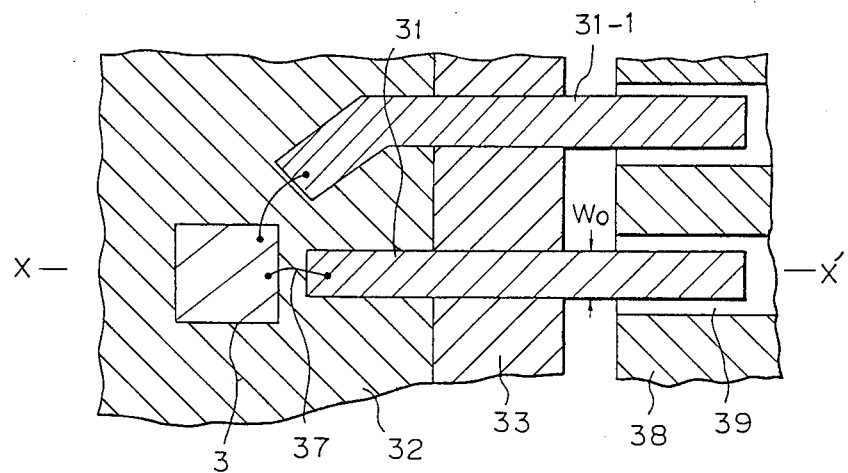

Referring to FIGS. 1a and 1b, an IC device includes a semiconductor IC chip 3 having a semiconductor substrate of Si or GaAs and a plurality of transistors and other circuit elements formed on the substrate and mounted on an insulation layer 32 of the ceramic or the like. The IC device also includes a stacked layer structure consisting of a conductive wire strip 31 formed on the insulation layer 32, a metal film 34 placed beneath the insulation layer 32 and mounted on another insulation layer 36. The IC device further includes a package including an insulator 33 and a metal cap 35. A cavity 20' wherein the IC chip 3 is located is defined and hermetically sealed by the package and the stacked layer structure. The conductive wire strip 31 is connected to a terminal of the IC chip 3 by solder. The conductive wire strip 31 extends outside of the IC device through a hermetic seal portion and is soldered to a connection wire 39 on a substrate 38 positioned outside and adjacent to the IC device. Accordingly, the conductive wire strip 31 functions as an external connection wire. Another conductive wire strip 31-1 (FIG. 1b) also can be provided.

In FIG. 1a, a portion of the conductive wire strip 31 indicated by reference $A_1'$ may be a microstrip line structure, because the metal film 34 is provided beneath the conductive wire strip 31 separated by the insulation layer 32, and the cavity 20' is provided above the conductive wire strip 31. In addition, another portion of the conductive wire strip 31 indicated by reference $A_2'$ may be a balanced-type strip line structure, i.e., a triplate strip line structure, because the conductive wire strip 31 is provided between the metal cap 35 and the metal film 34 separated by the insulator 33 and the insulation layer 32, both having the same thickness and same dielectric constant.

The thickness $t_0$ and width $W_0$ of the conductive wire strip 31 are identical at portions indicated by references $A_1'$ and $A_2'$. For example, when the dielectric constant $\epsilon$ of the insulator 33 and the insulation layer 32 is ten, i.e., $\epsilon = 10$, the thickness $d_0$ of the insulator 33 and the insulation layer 32 is 330 μm, i.e., $d_0 = 330$ μm, the thickness $t_0$ of the conductive wire strip 31 is 15 μm, i.e., $t_0 = 15$ μm, and the width $W_0$ of the conductive wire strip 31 is 300 μm, i.e., $W_0 = 300$ μm. Further a characteristic impedance $Z_0$ at the portion indicated by reference $A_1'$ is 50Ω, which is a desired characteristic impedance in the example. However, another characteristic impedance $Z_0'$ at the portion indicated by reference $A_2'$ will be reduced due to the effect of the dielectric constant of the insulator 33 and is approximately 33Ω. As a result, a mismatching between the characteristic impedance brings about a reflection loss.

The preferred embodiments of the present invention will now be described.

Referring to FIG. 2, an IC device 1 of an embodiment in accordance with the present invention includes a package 2 consisting of a cap 21 formed of an insulation material, an upper shield wall 22 formed of an insulation material, a seal layer 23 and a side wall 24 formed of an insulation material, an IC chip 3 including a plurality of circuit elements formed on a semiconductor substrate of Si or GaAs, and a stacked layer unit 11. The IC chip 3 is mounted on the top of the stacked layer unit 11 and is located in a hermetically sealed cavity 20 defined by the package 2 and the stacked layer unit 11. Generally speaking, the above insulation material is a dielectric material.

The IC device 1 is mounted on a printed circuit board 52 through conductive leads 51 and secured to a plate 53 through a stud 54 having one end fixed to a bottom surface 11-6C of the stacked layer unit 11, the shaft of the stud 54 passing through a hole 56 in the printed circuit board 52 and the plate 53, and the other end of the stud 54 being fastened thereto by a nut 55.

The stacked layer unit 11 includes six stacked layers 11-1 to 11-6. Each of the stacked layers 11-1 to 11-6 includes an insulation layer or a dielectric layer as shown by the layer 11-1b for the upper layer 11-1, and at least one conductive layer strip as shown by the strip 11-1a. The insulation layers 11-1b, etc., are formed of a sintered ceramic and have a thickness of approximately 330 μm and a dielectric constant of 10.

Two conductive wire strips 15-1 and 15-2 are also provided on the insulation layer 11-1b adjacent to the IC chip 3.

The conductive layer strips of the second layer 11-2 are used for ground lines or power supply lines. The conductive layer strips of the fourth and sixth layers 11-4 and 11-6 are also used for ground lines or power supply lines. Conductive layer strips of the third layer 11-3 are used for high speed signal lines. The conductive layer strips of the fifth layer 11-5 are used for low speed signal lines. Connection wires connecting between the circuit elements in the IC chip 3 are formed by the conductive layer strips and connection members embedded in the insulation layers in a direction perpendicular to the plane of the insulation layers and connecting between the circuit elements and the conductive layer strips. However, these internal connection wires are omitted in FIG. 2, because they do not directly pertain to the present invention.

Figure 3A:
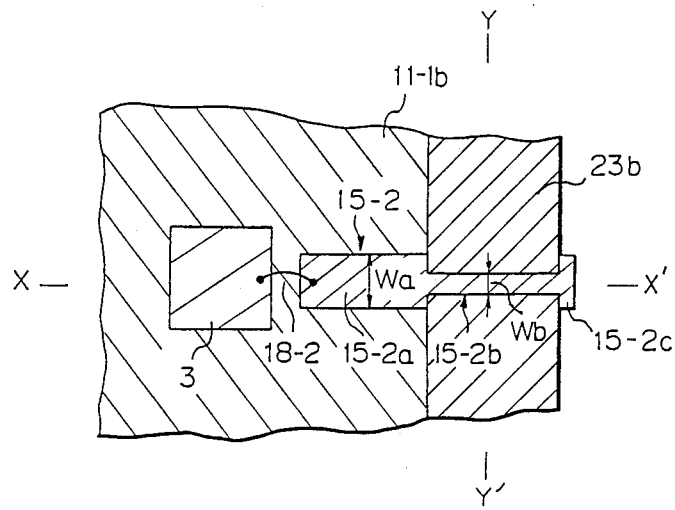
FIG. 3a is a plan view of a part of the IC device shown in FIG. 2, indicated by a reference $A_1$ and taken along the line H—H' in FIG. 2.
Figure 3B:
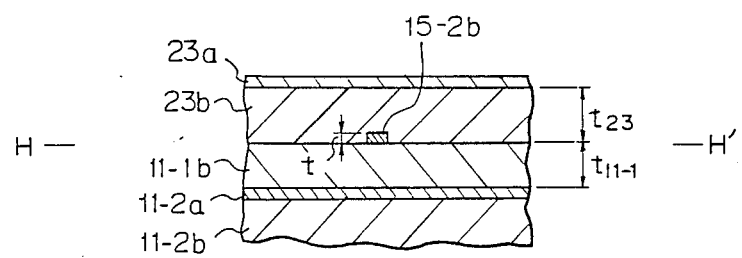

FIG. 3a is a plan view of the part of the IC device in FIG. 2 indicated by references $A_1$ and $A_2$ in FIG. 2 and taken along the line H—H' in FIG. 2. FIG. 3b is a sectional view of the IC device, taken along the line Y—Y' in FIG. 3a. FIGS. 3a and 3b correspond to FIGS. 1a and 1b discussed above.

In FIGS. 2, 3a, and 3b, the conductive wire strip 15-2 includes a wide width portion 15-2a, a narrow width portion 15-2b, and a wide width portion 15-2c. The width $W_a$ of the wide width portions 15-2a and 15-2c is 300 µm and the width $W_b$ of the narrow width portion 15-2b is 100 µm. The thickness t of the conductive wire strip 15-2b is 15 µm, throughout the portions 15-2a to 15-2c. The length of the narrow width portion 15-2b is identical to that of the seal layer 23. The conductive wire strip 15-2 functions as an external connection wire which electrically couples the IC chip to other IC devices. One end of the conductive wire strip 15-2 is connected to a terminal of the IC chip 3 at the wide width portion 15-2a inside of the IC device through a wire 18-2 and another end of the conductive wire strip 15-2 may be connected to other circuits in other IC devices by the wide width portion 15-2c outside of the IC device and extending on the side wall 24. The wide width portion 15-2C may be formed as a coplanar line.

The portion of the wide width portion 15-2a of the conductive wire strip 15-2 indicated by reference $A_1$ in FIG. 2 is similar to that shown in FIG. 1a and thus is formed as a microstrip line structure, because the conductive layer 11-2a formed on the insulation layer 11-2b of the second layer 11-2 is provided beneath the wide width portion 15-2a and the cavity 20 is provided above the wide width portion 15-2a. The insulation layer 11-1b between the wide width portion 15-2a of the conductive wire strip 15-2 and the conductive layer 11-2a is also formed of a sintered ceramic and has a thickness of approximately 330 µm and a dielectric constant of 10. As a result, a characteristic impedance of the microstrip line structure is 50Ω.

In addition, another portion of the conductive wire strip 15-2 indicated by reference $A_2$ includes the seal layer 23 consisting of an insulation layer 23b formed of a sintered ceramic and having a thickness $t_{23}$ of approximately 330µm, identical to the thickness $t_{11-1}$ of the insulation layer 11-1b, and a dielectric constant of 10, and a conductive layer 23a formed in the insulation layer 23b, a narrow width portion 15-2b having the width Wb of 100 µm which is narrower than that of the wide width portion 15-2a, and the conductive layer 11-2a. Capacitors are formed in the insulation layer 23b and the insulation layer 11-1b. Accordingly, a triplate strip line portion is formed. By providing the above capacitors above and below the portion 15-2b, the width $W_b$ of the narrow width portion 15-2b may be reduced. In this triplate strip line portion, the width $W_b$ of the narrow width portion 15-2b, i.e., $W_b$=100 µm, is designed so that any adverse affect due to the dielectric constant of the insulation layer 23b may be cancelled. As a result, a characteristic impedance of the triplate strip line portion is 50Ω, identical to that of the microstrip line structure set forth above.

Apparently, the impedance matching is achieved throughout the conductive wire strip 15-2 as the external connection wire, with the result that losses such as reflection loss do not occur.

The essence of the above embodiment is to make the characteristic impedance to the triplate strip line portion, which is affected by the insulation layer 23b, equal to that of the microstrip line portion. More specifically, the capacitance of the narrow width portion 15-2b is designed to have a predetermined impedance so that an impedance matching is achieved there between. The characteristic impedance can be arbitrary, such as 75Ω.

Figure 4:
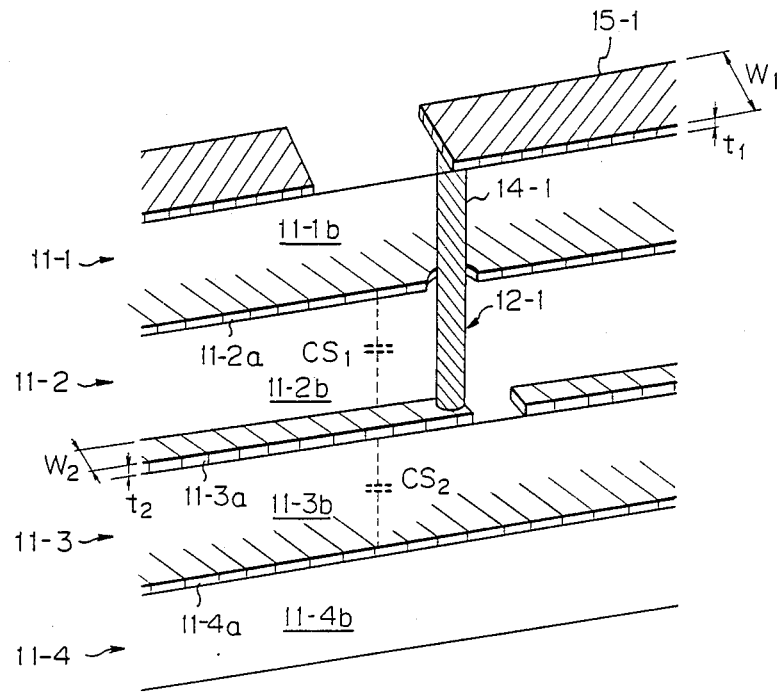
FIG. 4 is a perspective view of a part of the IC device shown in FIG. 2 and indicated by reference B.

FIG. 4 is a perspective view of the IC device at the portion indicated by reference B in FIG. 2. In FIGS. 2 and 4, the conductive wire strip 15-1 formed on the insulation layer 11-1b is connected to the conductive strip 11-3a formed on the insulation layer 11-3b, through a viahole 14-1 which is formed by forming an electrically conductive material in a throughhole 12-1 (in a direction perpendicular to the plane of the stacked layer unit 11) and in the insulation layers 11-1b which 11-2b, and accordingly, provides an electrical path between conductive wire strip 15-1 and conductive strip 11-3b.

A structure formation stack by the conductive layer 11-2a, the insulation layer 11-1b, the conductive wire strip 15-1, and the cavity 20 above the conductive wire strip 15-1 is formed as a microstrip line portion in the same way as set forth with reference to FIGS. 3a and 3b. The thickness $t_1$ of the conductive wire strip 15-1 is 15 µm and the width $W_1$ 300 µm these being equal to those of the conductive wire strip 15-2. The thickness and material of the insulation layer 11-1b are as mentioned above. Accordingly, the characteristic impedance of the structure of the conductive wire strip 15-1 is 50Ω.

Another structure formed as a stack by the conductive layer 11-4a formed on the insulation layer 11-4b, the insulation layer 11-3b, the conductive strip 11-3a, the insulation layer 11-2b, and the conductive layer 11-2a is formed as a triplate strip line structure in the same way as set forth with reference to FIGS. 3a and 3b. Capacitors $CS_1$ and $CS_2$ are formed in the insulation layers 11-2b and 11-3b. The thickness $t_2$ of the conductive strip 11-3a is identical to that of $t_1$ of the conductive wire strip 15-2, and the width $W_2$ of 100 µm is identical to that of $W_b$ in FIG. 3a. By providing the capacitors $CS_1$ and $CS_2$ above and below the conductive strip 11-3a, the width $W_2$ may be reduced as described previously. The thickness and material of the insulation layer 11-3b are identical to those of the insulation layer 11-2b. The width $W_2$ is smaller than the width $W_1$, and accordingly, the triplate strip line structure has a characteristic impedance of 50Ω identical to that of the microstrip line structure of the conductive wire strip 15-1, even if the affect of the dielectric constant of the insulation layer 11-2b is felt, as described above with reference to FIGS. 3a and 3b.

In this embodiment, the impedance matching between the microstrip line structure and the triplate strip line structure is achieved through a connection line of the conductive wire strip 15-1, the viahole 14-1, and the conductive layer 11-3a, forming an external connection wire, with the result that losses such as reflection loss do not occur.

An end of the external connection wire is connected to a terminal of the IC chip 3 inside of the IC device, and another end outside of the IC device is connected to a coplaner line 25 mounted on the surface of the side wall 24 as shown in FIG. 2.

Many widely different embodiments of the present invention may be constructed without departing from the spirit and scope of the present invention. It should be understood that the present invention is not limited to the specific embodiments described in this specification, except as defined in the appended claims.

We claim:

1. An integrated circuit device, comprising:
   a first insulation layer having top and bottom surfaces;
   a strip line layer formed on the top surface of said first insulation layer and having a first portion of a first width, a second portion of a second width smaller than said first width, and a third portion of a width greater than said second width;
   a second insulation layer formed on said second portion of said strip line layer;
   a semiconductor chip mounted on the top surface of said first insulation layer and electrically coupled to said strip line layer;
   a first conductive layer formed on the bottom surface of said first insulation layer;
   a second conductive layer formed on said second insulation layer;
   a wall portion formed on said second conductive layer; and
   a cap formed on said, wall portion, said cap, said wall portion, said second conductive layer and said second insulation layer forming a hermetically sealed cavity, said first portion of said strip line layer being hermetically sealed within said cavity and, with said first insulation layer and said first conductive layer, forming a microstrip line structure having a first characteristic impedance, and said first insulation layer, said second portion of said strip line layer and said second insulating layer forming a triplate strip line structure having a second characteristic impedance equal to said first characteristic impedance.

2. An integrated circuit device according to claim 1, wherein said strip line layer has a same thickness throughout said first, second and third portions.

3. An integrated circuit device according to claim 1, wherein a thickness of said first insulation layer is approximately equal to a thickness of said second insulation layer.

4. An integrated circuit device, comprising:
   a first insulation layer;
   a second insulation layer formed below said first insulation layer;
   a viahole formed through said first and second insulation layers;
   a third insulation layer formed below said second insulation layer;
   a semiconductor chip mounted on said first insulation layer;
   a first strip line layer of a first width formed on said first insulation layer and electrically connected to said semiconductor chip;
   a first ground layer formed between said first and second insulation layers;
   a second strip line layer of a second width smaller than said first width and formed between said second and third insulation layers;
   a second ground layer formed on said third insulation layer; and
   an electrically conductive member embedded in said viahole in a direction perpendicular to a plane of said first and second insulation layers, said electrical conductive member connecting said first strip line layer and said second strip line layer and being electrically isolated from said first ground layer.

5. An integrated circuit according to claim 4, wherein said first and second strip line layers are substantially equal in thickness.

6. An integrated circuit according to claim 4, wherein said first, second and third insulation layers have substantially equal thicknesses.

7. An integrated circuit device, comprising:
   a semiconductor chip;
   cap means, having top and side walls, for hermetically sealing said semiconductor chip; and
   a triplate structure, comprising:
      a first insulation layer;
      a strip line layer of a predetermined length formed on said first insulation layer and having a first portion of a first width, a second portion of a second width smaller than said first width, and a third portion of a width wider than said second width, said strip line layer being coupled to said semiconductor chip, said strip line layer having equal characteristic impedances throughout its length; and
      a second insulation layer formed on said second portion of said strip line layer, forming a portion of said side walls of said cap means.

* * * * *

UNITED STATES PATENT AND TRADEMARK OFFICE
CERTIFICATE OF CORRECTION

PATENT NO. : 4,875,087
DATED : OCTOBER 17, 1989
INVENTOR(S) : AKIRA MIYAUCHI ET AL.

It is certified that error appears in the above-identified patent and that said Letters Patent is hereby corrected as shown below:

Col. 2, line 25, after "strip" insert --line--;

line 63, "of" should be --on--.

Col. 5, line 53, "in" should be --on--.

Col. 6, line 6, "to" should be --of--.

Signed and Sealed this

Twenty-first Day of August, 1990

Attest:

HARRY F. MANBECK, JR.

*Attesting Officer*   *Commissioner of Patents and Trademarks*